United States Patent [19]
Wheatley, Jr.

[11] 3,983,502
[45] Sept. 28, 1976

[54] BRIDGE-OUTPUT AMPLIFIER WITH DIRECT-COUPLED DIFFERENTIAL-MODE FEEDBACK

[75] Inventor: Carl Franklin Wheatley, Jr., Somerset, N.J.

[73] Assignee: RCA Corporation, New York, N.Y.

[22] Filed: Feb. 27, 1975

[21] Appl. No.: 553,634

Related U.S. Application Data

[63] Continuation-in-part of Ser. No. 363,630, May 24, 1973, abandoned.

[52] U.S. Cl. .................................. 330/14; 330/15; 330/17; 330/18; 330/22; 330/28; 330/30 D; 330/38 M; 330/146
[51] Int. Cl.² .................. H03F 1/34; H03F 3/213; H03F 3/26
[58] Field of Search .................. 330/14, 15, 17, 18, 330/22, 28, 38 M, 40, 30 D, 146

[56] References Cited
UNITED STATES PATENTS 3,212,019  10/1965  Schwartz ..................... 330/15 X
3,445,776  5/1969  Leidich ......................... 330/15
3,808,545  4/1974  Stanley ....................... 330/17 X FOREIGN PATENTS OR APPLICATIONS
769,243  10/1967  Canada
1,189,589  3/1965  Germany Primary Examiner—Siegfried H. Grimm
Attorney, Agent, or Firm—H. Christoffersen; S. Cohen; A. L. Limberg

[57] ABSTRACT

A bridge-output amplifier, comprising four transistor means connected in bridge responsive to a drive signal to supply opposite ends of a cross-arm load with push-pull output signals, has direct-coupled differential mode feedback to reduce the quiescent potential applied across the load. This feedback is provided by a difference amplifier having the push-pull output signals applied to respective ones of its inverting and non-inverting input circuits and supplying a feedback signal at its output circuit. This feedback signal is used to improve the balance of the bridge.

11 Claims, 2 Drawing Figures

BRIDGE-OUTPUT AMPLIFIER WITH DIRECT-COUPLED DIFFERENTIAL-MODE FEEDBACK

This application is a continuation-in-part of U.S. patent application Ser. No. 363,630 filed May 24, 1973, now abandoned.

BACKGROUND OF THE INVENTION

The present invention relates to bridge-output amplifiers and, more particularly, to degenerative feedback for such amplifiers.

A bridge-output amplifier employs four transistor means having their principal conduction paths connected in a bridge with the power supply being connected to one opposite pair of nodes and the load terminals being connected to respective ones of a second opposite pair of nodes. The transistor means in two opposing legs of the bridge have their conduction increased while the transistor means in the other two opposing legs either have their conduction decreased or are non-conductive. That is, the bridge output amplifier comprises first and second pairs of transistors, each pair of transistors having their principal conduction paths serially connected across the power supply and being operated as a push-pull amplifier to supply a separate one of the load terminals. Each of these component push-pull amplifiers responds to a common input signal in the opposite sense as the other to supply an output signal potential to its respective load terminal.

A principal advantage of the bridge-output amplifier is known to be that it permits the combined output signal potential swing between the load terminals to be twice the potential available from the power supply, so four times as much output power is available to the load as can be obtained with a pair of transistor means operated in push-pull. It is known that it is advantageous to differentially combine the signal potentials appearing at the load terminals of the bridge output amplifier to develop a feedback signal for degenerating the input signal controlling the relative conduction of the transistor means and thereby improve the linearity of the response of the difference of these signal potentials to the input signal.

Bridge-output amplifiers are known to be advantageous insofar as permitting the direct coupling of loads such as loudspeakers between their load terminals. Conventionally, the component push-pull amplifiers used in a bridge-output amplifier are adjusted to exhibit similar quiescent output signal potentials resulting in negligible quiescent current flow in the load. However, in certain bridge-output amplifiers such as those constructed in monolithic integrated circuit form it is infeasible to adjust the operating points of the component push-pull amplifiers. This presents the problem of reducing direct current flow through the load.

SUMMARY OF THE INVENTION

My invention is embodied in a bridge output amplifier wherein differential-mode direct-coupled degenerative feedback is used to reduce direct current flow through the load. This direct-coupled degenerative feedback is obtained by differentially combining the quiescent potentials appearing at the load terminals of the bridge-output amplifier to develop a feedback signal subsequently used for adjusting the quiescent balance of the bridge to reduce the difference between those quiescent potentials. Further, the dominating influence of this direct-coupled degenerative feedback upon quiescent potential difference between the load terminals is assured by eschewing individual feedback of comparable effectiveness around at least one of the component push-pull amplifiers. In preferred embodiments of my invention, the differential-mode direct-coupled degenerative feedback loop is not fully by-passed for signal variations, thereby securing linearization of the response of the combined output signal potential swing between the load terminals to the input signal without need for additional circuitry.

DETAILED DESCRIPTION

Figure 1:
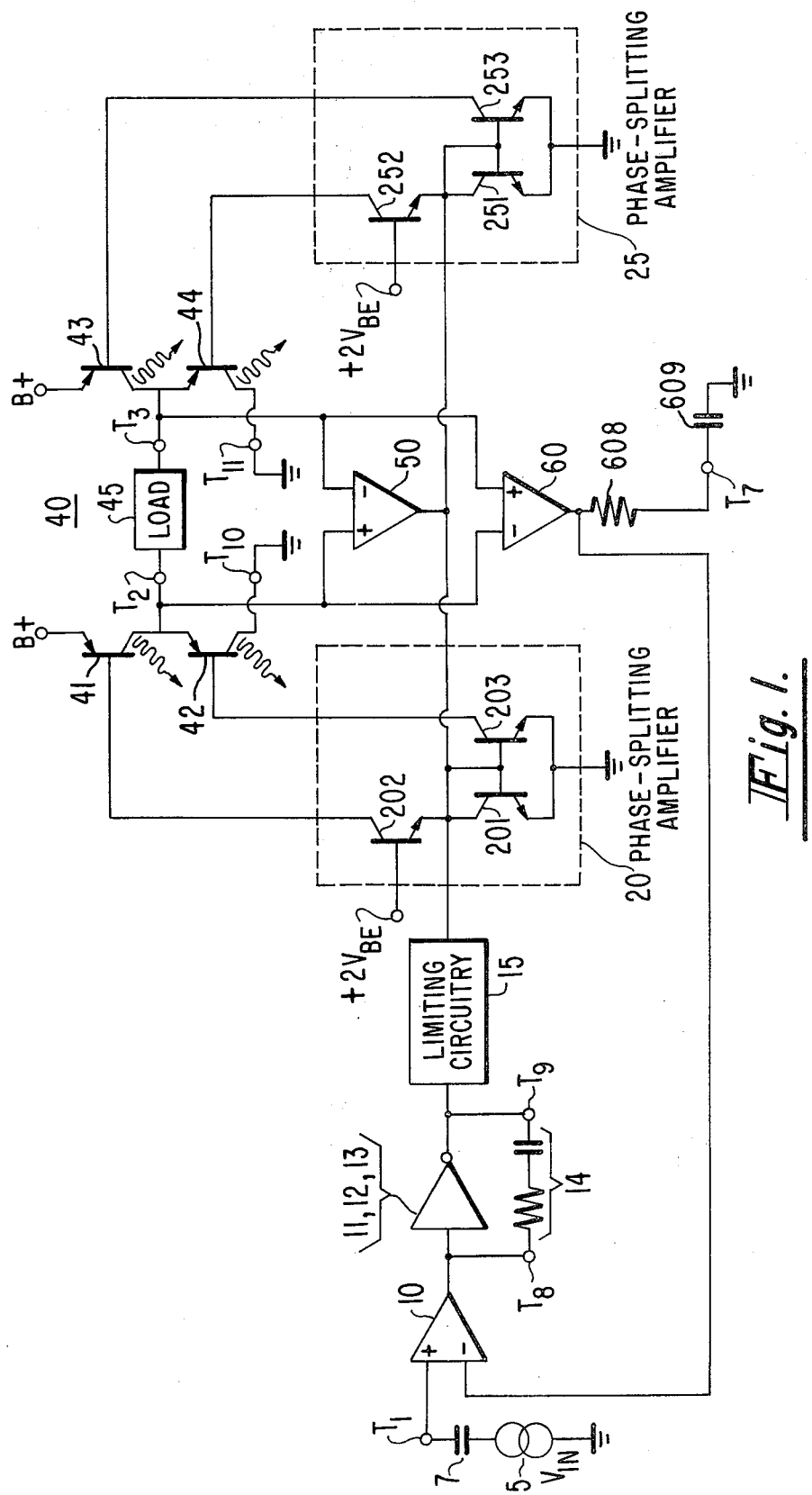
FIG. 1 is a simplified schematic diagram, partially in block form, of a bridge-output amplifier embodying my invention.

A source 5 supplies an input signal potential $v_{IN}$, which is coupled through capacitor 7 to terminal $T_1$ of the bridge-output amplifier shown in FIG. 1. The input signal $v_{IN}$ is applied to the non-inverting input circuit of a difference amplifier 10, which has an inverting input circuit connected as shall be described to receive overall feedback. Difference amplifier 10 provides an amplified response to the error signal developed by the subtraction of its input signals—that is, to the input signal $v_{IN}$ as degenerated by the overall feedback. This response is applied to the input circuit of a cascade of amplifiers 11, 12, 13, which are provided a local a-c feedback connection via the series RC combination 14, for further amplification. The further amplified degenerated input signal is then applied to limiting circuitry 15 for conversion to a bidirectional signal current with symmetrical limitations as to its maximum positive and maximum negative excursions.

This bidirectional signal current is suitable for application to the paralleled input circuits of phase-splitting amplifiers 20 and 25. Each of these paralleled input circuits accepts a half of this bidirectional signal current and responds thereto to provide a pair of Class B push-pull output currents. The phase-splitting amplifiers 20, 25 are each of the type described in U.S. Pat. No. 3,573,645, entitled "PHASE-SPLITTING AMPLIFIER"; issued Apr. 6, 1971 to the present inventor Carl Franklin Wheatley, Jr., and assigned to RCA Corporation.

The pair of Class B push-pull output currents provided by phase-splitting amplifier 20 are applied to the base electrodes of transistors 41 and 42, respectively, which transistors are connected as a first push-pull amplifier of the bridge-output output amplifier stage 40 to supply an output signal at terminal $T_2$. The pair of Class B push-pull output currents of phase-splitting amplifier 25 are applied to the base electrodes of transistors 43 and 44, respectively. This is done such that the second push-pull amplifier of the bridge-output output amplifier stage 40, which comprises transistors 43 and 44, supplies an output signal to terminal $T_3$ which is of opposite sense of signal swing to that supplied to terminal $T_2$ by the first push-pull amplifier, which comprises transistors 41 and 42. (Transistors 41, 42, 43 and 44 as shall hereinafter be explained may each be a composite transistor structure; PNP power transistors in particular are advantageously constructed as a composite transistor structure when they are to be included in a standard monolithic integrated circuit.) Load 45 is connected between terminals $T_2$ and $T_3$ as the cross-arm of the bridge structure comprising transistors 41, 42, 43 and 44.

Direct-coupled local feedback is provided around the bridge-output amplifier stage 40 and phase-splitting amplifiers 20 and 25 by differentially combining the signals at terminals $T_2$ and $T_3$ in difference amplifier 50 to develop a degenerative feedback signal summed with the bidirectional signal current applied to the parallelled input circuits of phase-splitting amplifiers 20 and 25. Direct-coupled overall feedback is provided the entire FIG. 1 amplifier by differentially combining the signals at terminals $T_2$ and $T_3$ in difference amplifier 60 to develop an overall feedback signal for application to the inverting input circuit of difference amplifier 10 to degenerate the input signal $v_{IN}$. This overall feedback is usually partially bypassed for a-c signal by a capacitor; FIG. 1 shows such a capacitor connecting terminal $T_7$ to signal ground.

PNP output transistors 41, 42, 43, 44 are provided base currents from the collector electrodes of transistors 202, 203, 253, 252, respectively. The transistors 202, 203, 253, 252 function as current sources, since their source impedance is much higher than the input impedances presented at the base electrodes of transistors 41, 42, 43, 44 under conditions of normal loading by a load 45. This results in the current gains of the output stages being determined primarily as a function of the common-emitter forward current gains of transistors 41, 42, 43 and 44—that is, their betas or $h_{fe}$'s—and substantially independently of their transconductances—that is, their $g_m$'s.

On the other hand, consider amplifier stages where the transistors have their operating points stabilized by application of temperature-dependent potentials across their base-emitter junctions (as may be done, for example, by connecting forward-biased diode networks across the transistor base-emitter junctions). Signals are usually applied to the base electrodes of these transistors from relatively low source impedances so that the stabilization of their respective operating points is not interfered with. The gains of such amplifier stages are therefore determined by $g_m$ rather than $h_{fe}$. That is, these amplifier stages are operated as transconductance amplifiers, while transistors 41, 42, 43 and 44 of my bridge-output output amplifier stage are operated as current amplifiers.

There are very good reasons for wanting to operate the output amplifier stages in a monolithic integrated circuit as a current amplifier rather than a transconductance amplifier. The article "High-Impedance Drive for the Elimination of Crossover Distortion" by James J. Faran, Jr. and Robert G. Fulks appearing on pp. 36–40 of the August 1961 issue of *The Solid State Journal* points out the inherently better linearity of current amplification as compared to transconductance amplification using transistors. This comes about because of $g_m$ of a junction transistor varies linearly with transistor emitter current level, but the $h_{fe}$ of a transistor can be made substantially invariant over a range of emitter current. The article also points out that, while temperature-sensitive elements such as diodes or thermisters can be included in the base bias networks of the transistors to maintain their operating points satisfactorily constant despite ambient temperature changes, the temperature-sensitive elements cannot instantaneously follow changes in the temperatures of the base-emitter junctions of the transistors when a suddenly applied signal heats up the transistors. Therefore, the danger of thermal runaway may still exist.

Indeed, in monolithic-integrated-circuit power amplifiers, it has proven to be very difficult to track the conduction characteristics of the semiconductor junctions used as temperature-sensitive elements with the conduction characteristics of the output transistors. I believe this is because the steep and rapidly changing thermal gradients on the integrated circuit prevent the output transistors and the semiconductor junctions which determine their base bias potentials from ever attaining temperatures which have the constant offset from each other which is required for obtaining good tracking between their conduction characteristics.

Now, it has been observed that for constant output current levels, the $h_{fe}$ of a silicon transistor varies only 0.7% per degree Kelvin while the $g_m$ of a silicon transistor varies 8 to 9% per degree Kelvin. I believe this fact to be particularly significant in the design of push-pull power amplifier stages. Differences occur in the temperature of the transistors operated in push-pull so their gains tend to change relative to each other, as a function of temperature, giving rise to a changing non-linearity of the power amplifier stage. Operation of the transistors as current amplifiers rather than transconductance amplifiers permits taking advantage of the lower non-linearity as a function of temperature exhibited by the $h_{fe}$'s of the transistors as compared to their $g_m$'s.

An underlying reason, then, why I advocate biasing the output transistors 41, 42, 43, 44 from high—rather than low—impedance sources is that the changing thermal gradients on the integrated circuit have less effect upon the gains of the output transistors 41, 42, 43, 44. Their gains stay relatively constant and more equal to each other despite the rapidly changing temperature conditions at each different portion of the integrated circuit. A substantial source of distortion in the output signals of prior-art integrated circuit amplifiers is this variation in the gain of the output transistors in response to their temperature changes, which temperature changes arise in response to the electrical signals the output transistors amplify. A push-pull amplifier where the output transistors are operated as current amplifiers, with their base currents supplied from relatively high impedance sources as compared to their base input impedances, rather than as transconductance amplifiers with their base currents supplied from relatively low impedance sources, is relatively free of this type of distortion.

I have discerned that this way of operating the output transistors has some very interesting operating phenomena associated with it, which, in the absence of electrical feedback around the output stages, tend to equalize the relative thermal dissipations from the transistors. (The thermal dissipations from transistors 41, 44 are indicated in FIG. 1 by the wavy arrows directed away from each of these transistors.) The quiescent potential appearing at terminal $T_2$ is determined by the relative conduction of transistors 41 and 42, not by any emitter-follower action of transistor 42. The quiescent potential appearing at terminal $T_3$ is determined by the relative conduction of transistors 43 and 44, not by any emitter-follower action of transistor 44. Absent electrical feedback around the transistors 41, 42, 43, 44, they are not constrained by their base biasing from adjusting their relative collector-to-emitter potentials in response to their respective temperatures affecting their relative current gains. The higher-beta ones of the transistors 41, 42, 43, 44 will operate closer to saturation than the lower-beta units—that is, the higher-beta units will have lower "collector-to-base emitter" voltages than the lower-beta units. Consequently, the dissipation in the higher-beta units is smaller than that of the lower-beta units, and their temperatures do not rise as high as those of the lower-beta units. Consequently, the betas of the higher-beta units are reduced with respect to those of the lower-beta units, since beta increases with increasing temperature. The higher "collector-to-emitter" voltages of the lower-beta units will cause them to have increased dissipation, which increases their temperature and consequently their betas. The output composite transistors 41, 42, 43, 44 therefore in effect operate so as to balance their dissipations to be more equal.

This balancing phenomenon has not been permitted to operate in most prior art amplifiers. The biasing of the base electrodes of the output transistors from relatively low source impedances or with a fixed potential offset therebetween prevents the phenomena, and the employment of direct-coupled voltage feedback around a push-pull amplifier interferes with the phenomenon. This balancing phenomenon is interfered with to much lesser extent in my FIG. 1 bridge-output amplifier. The direct-coupled degenerative feedback loops including difference amplifiers 50 and 60, respectively tend to maintain the collector-to-emitter potentials of transistors 41 and 43 each the same as the other and the collector-to-emitter potentials of transistors 42 and 44 each the same as the other. However, there is no restraint upon transistors 41 and 43 adjusting their collector-to-emitter potentials to be different from the collector-to-emitter potentials of transistors 42 and 44.

The action of the direct coupled feedback loop is to reduce the difference in direct potential between terminals $T_2$ and $T_3$ and thereby to reduce the tendency for flow of direct current through load 45, the flow of substantial direct currents through load 45 generally being undesirable. To further this end, the overall feedback loop containing difference amplifier 60 has substantially higher d-c gain than a-c gain. These feedback loops are only concerned with the differential behavior of the first push-pull amplifier comprising transistors 41, 42 and of the second push-pull amplifier comprising transistors 43, 44. This differential behavior is all that affects the direct current flow in load 45 or the distortion of the signal applied to it. Common-mode distortion in the output signal potentials appearing at terminals $T_2$ and $T_3$ does not result in distorted signal potential appearing across the load 45.

I purposely avoid attempting to make the output signal potentials at terminals $T_2$ and $T_3$ be low-distortion linearly amplified replicas of the input signal by applying potential feedback around the first push-pull amplifier individually and around the second push-pull amplifier individually. Such separate common-mode feedback around each push-pull amplifier undesirably tends to work against the differential-mode feedback taken from terminals $T_2$ and $T_3$ by difference amplifiers 50 and 60 and used for degenerating the quiescent potential and the distortion components in the signal potential which appear across load 45. Such common-mode feedback would also restrain the thermal balancing of the operating points of transistors 41, 43 as against those of transistors 42, 44.

Now, this thermal balancing process may cause the common-mode quiescent potentials at terminals $T_2$ and $T_3$ to approach B+ operating potential more closely than B− ground reference potential, or vice versa. Now, it is well-known that in a single push-pull amplifier using stacked output transistors if the quiescent output potential should not be midway between B+ and B− potentials, the output power which the amplifier can deliver without clipping is reduced. I have discovered that our common experience misleads us when it comes to the bridge-output amplifier with differential-mode-only feedback. The output power the bridge-output amplifier can deliver without clipping is unaffected by the quiescent potential appearing at terminals $T_2$ and $T_3$.

Suppose that the common-mode quiescent potential at terminals $T_2$ and $T_3$ is closer to B+ than to ground potential. While it is true that transistor 41 will run into saturation with smaller, more positive output signal potential swing at terminal $T_2$, transistor 44 has a commen-surately larger range for less positive signal potential swing at $T_3$ before it runs into saturation. When transistor 41 goes into saturation, the differential mode feedback simply reacts to decrease base current drive to transistor 41 and to increase base current drive to transistor 43. Linear amplification insofar as the signal potential applied across the load 45 is concerned continues until transistor 44 as well as transistor 41 is saturated. The peak potential applied across load 45 is full B+ potential just as if the quiescent potentials on terminals $T_2$ and $T_3$ had been one-half B+ potential. Transistors 43 and 42 interact similarly when the potential at terminal $T_3$ swings more positive and the potential at terminal $T_2$ swings less positive than quiescent value, so the peak potential applied to load 45 for these directions of swing is also full B+ potential just as if the quiescent potentials on terminals $T_2$ and $T_3$ had been one-half B+ potential. The peak-to-peak potential swing across load 45 is twice B+ potential, the same as with conventional operation, so power output to the load 45 is not reduced. Since the quiescent emitter-to-collector potentials of transistors 42 and 44 exceed those of transistors 41 and 43, at higher signal current levels the internally heating of transistors 42 and 44 will exceed that of transistors 41 and 43 by increased margins. This will tend to cause readjustment of the quiescent potentials on terminals $T_2$ and $T_3$ back toward one-half B+ potential.

Observations analagous to those of the previous two paragraphs can be made concerning operation when the common-mode quiescent potential at terminals $T_2$ and $T_3$ is closer to ground than to B+ potential.

Figure 2:
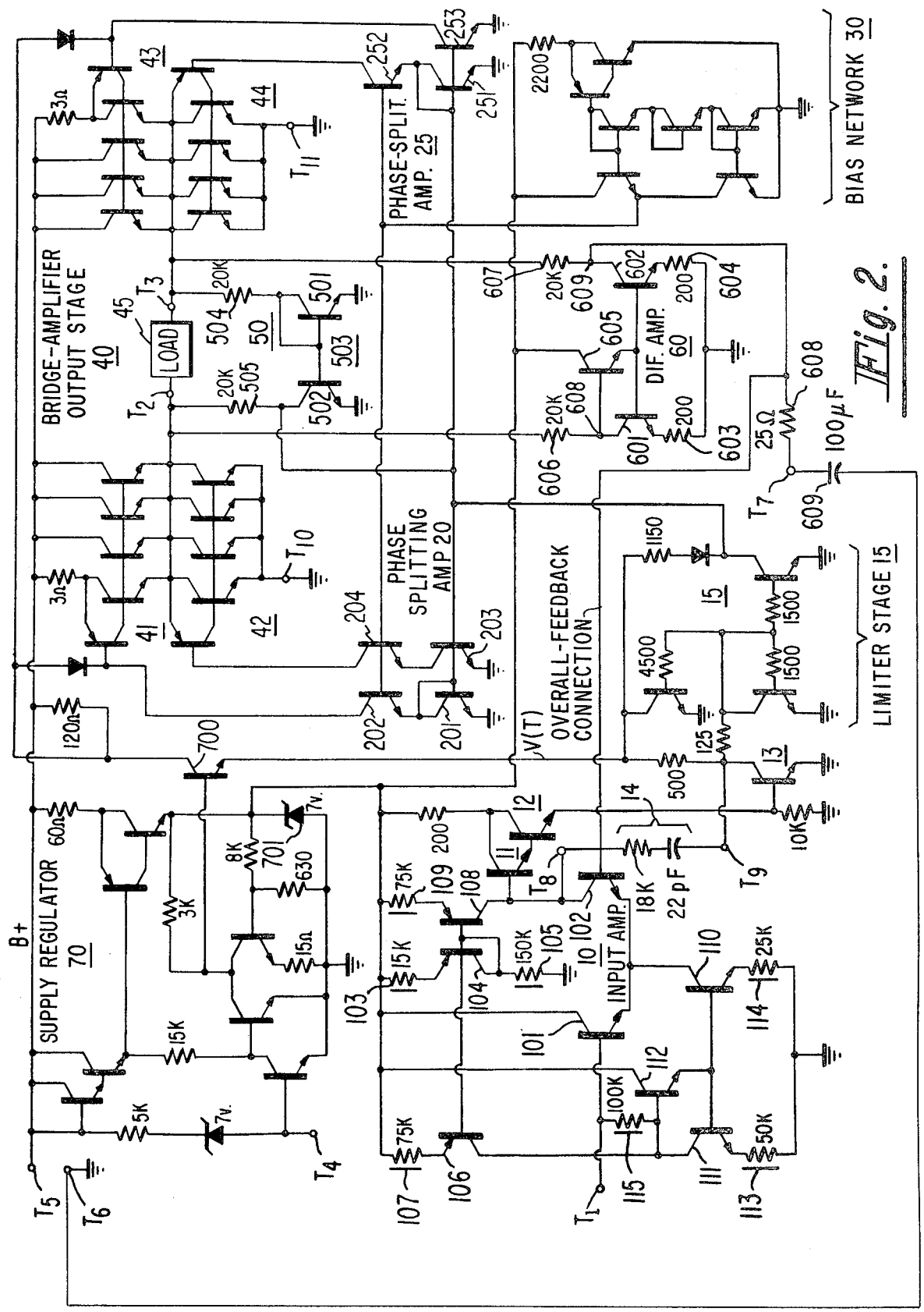
FIG. 2 is a complete schematic diagram of the bridge-output amplifier as constructed in monolithic integrated circuit form.

FIG. 2 is a more detailed schematic showing how the FIG. 1 bridge-output amplifier is actually realized in monolithic integrated circuit form. Except for the load 45, the series RC combination 14 and capacitor 609 all the elements are included within the monolithic integrated circuit. Resistor symbols having an adjacent bar denote resistors which are fabricated as pinch resistors. Certain aspects of the design not fully described in connection with FIG. 1 will now be treated.

Input signals applied to terminal $T_1$ are successively amplified in an emitter-coupled difference-amplifier input amplifier stage 10, in common-collector amplifier transistors 11, 12 connected in Darlington cascade and in grounded-emitter transistor amplifier 13. The Darlington cascade of transistors 11, 12, 13 is provided phase-compensating local negative feedback by a series RC network 14 typically comprising an 18 kilohm resistor in series with a 22 picofarad capacitor. This RC network 14 is located outside the integrated circuit and is connected between terminals $T_8$ and $T_9$. The collector current of transistor 13 is applied as input current to a stage 15, which provides symmetrical peak-to-peak limiting of signal current excursions exceeding values determined in response to the temperature of the integrated-circuit amplifier. The operation of this peak-to-peak limiting stage 15 and of the supply regulation circuitry 70 is explained fully in my U.S. patent application Ser. No. 553,636 concurrently filed herewith, entitled "AMPLIFIER WITH OVER-CURRENT PROTECTION" and, like the present application, assigned to RCA Corporation.

Stage 15 reduces the maximum peak-to-peak excursions of its output current when the potential at the emitter electrode of transistor 700 in the supply regulation circuitry 70 is reduced, finally providing no output current as the emitter potential of transistor 700 approaches ground reference potential. The emitter potential of transistor 700 may be reduced in response to any of the following three things: (1) the temperature of the integrated circuit increasing above a threshold value, (2) B+ potential as applied to terminal $T_5$ decreasing below a threshold value, (3) terminal $T_4$ being clamped to ground potential to provide "squelch"—that is, to cause substantially no response between terminals $T_2$, $T_3$ to input signals applied between terminals $T_1$, $T_6$.

The output signal current from the current limiter 15 is divided between the input circuits of phase-splitting amplifiers 20, 25, each of which responds to its respective half of this current to provide a pair of Class B push-pull signal currents.

The phase-splitting amplifiers 20, 25 are biased from the bias network 30 so as to provide to the composite output transistors 41, 42, 43, 44 quiescent base currents which vary inversely with the beta (common-emitter forward current gain) of these transistors. This facilitates the reduction of cross-over distortion in the Class B power amplifier output stages while maintaining their internal dissipation at a minimum, over broad ranges of temperature variations and of manufacturing tolerances on transistor characteristics. These aspects of the amplifier configuration shown in the FIGURE are more fully explained in my U.S. Pat. No. 3,886,466 issued May 27, 1975; entitled "BIAS CIRCUITRY FOR STACKED TRANSISTOR POWER AMPLIFIER STAGES" and, like the present application, assigned to RCA Corporation.

Common-base amplifier transistor 204 is connected in cascode with transistor 203 to isolate its collector electrode from signal variations which would otherwise be developed thereat by composite transistor 42 reacting to the current supplied to it therefrom. Such variations would undesirably affect the current gain of transistor 203 by a small amount and so provide a source of distortion.

Each of the output transistors 41, 42, 43, 44 is shown in FIG. 2 as being a composite transistor. This is a current amplifier device comprising an input PNP transistor, the base electrode of which forms the effective "base" electrode of the composite transistor, and a plurality of parallelly connected NPN output transistors, the joined emitter electrodes of which form the effective "collector" electrode of the composite transistor. The effective "emitter" electrode of the composite transistor is the point to which the emitter of the input PNP transistor and the collector electrodes of the NPN output transistors are connected. The collector electrode of the PNP transistor is coupled to the base electrode of the NPN output transistors. Each of the composite transistors 41, 42, 43, 44 behaves as a PNP transistor having an effective beta substantially equal to the beta of its input PNP transistor times the beta of one of its output NPN transistors (presuming the betas of the NPN component transistors to be equal). The effective base, emitter and collector electrodes of the composite transistor will be referred to as base, emitter and collector electrodes, respectively, throughout the rest of this application. Composite transistors 41, 42 are each connected in push-pull for signal and are stacked for serial quiescent "collector-to-emitter current flow. Composite transistors 43, 44 are similarly connected with each other.

The connections of the phase-splitting amplifier 20 to the base electrodes of transistors 41, 42, is such that output signals at a terminal $T_2$ are of opposite sense of swing to the input signals at terminal $T_1$. The connections of the phase-splitting amplifier 25 to the base electrodes of transistors 43, 44 are such that the output signals at a terminal $T_3$ are of the same sense of swing as the input signals at terminal $T_1$. Terminals $T_{10}$, $T_{11}$ conduct the collector currents of composite transistors 42, 44, respectively, off-die to ground reference potential.

The anti-phase output signals at terminals $T_2$ and $T_3$ are differentially combined in a difference amplifier 50 to provide a degenerative feedback signal to the input circuits of the phase-splitting amplifiers 20, 25. Thus, local degenerative feedback is provided around the output amplifier stages 41, 42, 43, 44 and the phase-splitting amplifiers 20, 25.

The anti-phase output signals at terminals $T_2$ and $T_3$ are also differentially combined in a difference amplifier 60 to obtain a degenerative feedback signal. This feedback signal is applied to the input amplifier stage 10 to provide overall degenerative feedback for the entire audio amplifier. Terminal $T_7$ is bypassed to ground reference potential for audio signals with a large capacitor 609 (typically, 100 microfarads) located outside the integrated circuit. Capacitor 609 provides the dominant low-frequency time constant for the overall feedback. The high direct-current gain in the overall feedback loop is preserved so that minimal direct-current potential appears across the load 45, but the loop gain for signal is reduced to maintain just sufficient degeneration of signal to obtain low distortion.

The use of local feedback around the output stages 41, 42, 43, and 44 and phase-splitting amplifiers 20, 25 improves phase response in that portion of the amplifier which is included within the overall feedback loop, thereby protecting against regeneration at higher frequencies, particularly when the load 45 is inductive in nature.

The local feedback loop maintains the quiescent potentials at terminal $T_2$, $T_3$ substantially equal when the peak-to-peak excursion of output current from the limiter stage 15 is reduced to zero, interrupting the operation of the overall feedback loop. Maintaining the quiescent potentials at terminal $T_2$, $T_3$ substantially equal permits difference amplifier 60 to maintain substantially the same potentials at node 609 when the overall feedback loop is interrupted by the gain of amplifier 15 having been in effect reduced to zero, as when the overall feedback loop is operative. The charge on the capacitor bypassing terminal $T_7$ therefore will not be affected much when the gain of amplifier 15 is varied. This prevents undesirable low-frequency transients from appearing between terminals $T_2$, $T_3$ as squelch is applied by clamping terminal $T_4$ to ground potential.

The difference amplifiers 50, 60 used to correct differential-mode distortion in the output signals should be able to accept input signals which range over substantially the entire range between B+, which typically is 10 volts or more, and ground. These amplifiers should exhibit good common-mode rejection since as pointed out in the previous paragraph, it is necessary to minimize common-mode feedback around the output amplifier stages 41, 42, 43, 44. It is desirable that the difference amplifier stages 50, 60 should provide direct potential translation to place their output signals at a correct potential for being direct coupled to the stage to which they are to be applied.

These requirements could be met by using a difference amplifier with emitter-coupled transistors, a constant-current source for supplying the emitter currents of those transistors, emitter degeneration resistors to increase the amplitude of input signals which can be handled, and a current mirror amplifier to provide active collector loads for the emitter-coupled transistors. However, preferred embodiments of the difference amplifiers 50, 60 as shown in FIG. 2 meet the requirements set forth in the previous paragraph, but need no more than a pair of matched resistors and a current mirror amplifier.

The quiescent input potential across the input circuits of phase-splitting amplifiers 20, 25 tends to be $1V_{BE}$, because of the regulating action of the input transistors having direct connection between their collector and base electrodes. $V_{BE}$ is the offset potential across the forward-biased emitter junction of a transistor and although a function of emitter current load and operating temperature is substantially constant from one transistor to another, if they are made from the same semiconductor material.

The difference amplifier 50, were its connections to phase-splitting amplifiers 20 and 25 severed, should supply degenerative-feedback correction signals with a quiescent potential $1V_{BE}$ more positive than reference potential. This permits direct coupling of the correction signals to the input circuits of phase-splitting amplifiers 20, 25 without resultant direct current flow to disturb their quiescent bias conditions.

Consider then, for analytical purposes, the operation of the difference amplifier 50, when its connection to phase-splitting amplifiers 20, 25 is severed. Transistors 501 and 502 are connected in a current mirror amplifier configuration 503 with input and output nodes at the collector electrodes of transistors 501 and 502, respectively. The direct connection from the collector to base electrodes of the transistor 501 maintains its collector electrode offset from the reference potential by its base-emitter offset voltage, $1V_{BE}$, while regulating its collector current to accept the consequent current flow through resistor 504.

Since the base-emitter junctions of transistors 501, 502 are constrained by their parallel connection to have identical offset potentials, their collector currents are substantially equal. A current substantially equal to the current flowing through resistor 504 as caused by potential impressed thereacross will therefore flow in resistor 505. Since resistor 505 has the same resistance as resistor 504, a potential equal to that across resistor 504 will appear across resistor 505.

The potential at the collector electrode of transistor 502 is equal to the potential at terminal $T_2$ minus the potential across resistor 505. The potential across resistor 505 is equal to the potential across resistor 504 and therefore is equal to the potential at terminal $T_3$ minus $1V_{BE}$. Therefore, the potential at the collector electrode of transistor 502 is equal to the potential at terminal $T_2$ minus that of terminal $T_3$, plus $1V_{BE}$. The potentials at terminals $T_2$ and $T_3$ are, therefore, differentially combined. When the direct components of these potentials are equal, the open-circuit quiescent potential at the collector electrode of transistor 502 is at $1V_{BE}$, as desired.

When the connections of the output circuit of difference amplifier 50 to the input circuits of phase-splitting amplifiers 20, 25 which were severed only for purposes of analysis are intact, the circuit operates in the following way. The potential at the collector electrode of transistor 502 is constrained at $1V_{BE}$ potential by the input circuits of the phase-splitter amplifiers 20, 25; and the collector potential of transistor 501 is also constrained at $1V_{BE}$ by its collector-to-base feedback. The potential at terminal $T_2$ causes a certain current in resistor 505. If the potential at terminal $T_3$ is substantially the same as that at terminal $T_2$, the current in resistor 504 is similar to that in resistor 505, and causes a corresponding collector current in transistor 502 because of the current mirror amplifier 503. The current flow in the resistor 504 supplies this collector current to transistor 502, and no current is provided to the input circuits of phase-splitting amplifiers 20, 25. If the potential at terminal $T_2$ is more positive than that at terminal $T_3$, the current flow in resistor 505 more than suffices to supply the collector current required by transistor 502 and the excess current is applied to the input circuits of phase-splitter amplifiers 20, 25. If the potential at terminal $T_2$ is less positive than that at terminal $T_3$, the current flow in resistor 505 is insufficient to supply the collector current requirements of transistor 502, and the deficiency is drawn from the input circuits of phase-splitting amplifiers 20, 25.

The difference amplifier 60 is arranged to supply to the input stage 10 degenerative feedback correction signals with a quiescent potential substantially equal to that appearing at the base electrode of transistor 101. The base electrodes of transistors 101, 102 of input stage 10 must be operated more than $1V_{BE}$ more positive than the reference potential to permit emitter-coupled differential amplifier-action between them. This emitter-coupled difference amplifier action is used to differentially combine input signal and feedback signals applied to the base electrodes of transistors 101 and 102, respectively. The collector current of transistor 102 provides an error signal for subsequent amplification in elements 11; 12; 13; 15; 20, 25; 41, 42; 43, 44 to appear as output signals between terminals $T_2$, $T_3$.

The biasing of the input stage 10 is accomplished in the following manner when the beta of the NPN transistors in the integrated circuit is low and the pinch resistors have resistances which are maintained in constant ratio with each other.

A reference current flow is established in response to the 7 volt potential developed across avalanche diode 701 being impressed across the series connection of resistor 103, diode-connected PNP transistor 104 and resistor 105. The potential across the base-emitter circuit of transistor 104 (including resistor 103) is applied to the base-emitter circuit of PNP transistor 106 (including resistor 107) and to the base-emitter circuit of PNP transistor 108 (including resistor 109). The relative resistances of resistors 103, 107 and 109 and the relative base-emitter junction areas of transistors 104, 106, 108 are such that the collector currents of transistors 106, 108 are each one-fifth as large as that of transistor 104. The collector current of transistor 108 supplies constant quiescent current to the collector electrode of transistor 102.

To operate the emitter-coupled transistors 101, 102 with substantially equal collector currents, the collector current of transistor 110 has to be twice that of transistor 108. Such operation is desirable so that the full dynamic range available from the input stage can be used. The collector current of transistor 106 substantially flows as collector current to transistor 111. The collector-to-base negative feedback provided to transistor 111 by the common-collector amplifier transistor 112 causes the collector current of transistor 111 to be regulated so as to ensure this condition. A potential is developed across the base-emitter circuit of transistor 111, including resistor 113, which when applied to the base-emitter circuit of transistor 110 (including resistor 114) causes a collector current flow in transistor 110 twice as large as that of transistors 108, 106, 111. This results from the proportioning of the resistances of resistors 113, 114 and the base-emitter junction areas of transistors 111, 110.

The potential across resistor 103 will, by resistive potential divider action between itself and resistor 105, be substantially equal to one eleventh of the following: the 7 volt potential across the avalanche diode 701 minus the 0.65 volt potential across the base-emitter junction of diode-connected transistor 104. This resulting potential, about 0.6 volt, appears across resistor 107 because of the parallel connection of the base-emitter circuits of transistors 104, 106. Since the collector currents of transistors 106, 111 are substantially equal and since their emitter currents substantially equal their collector currents (as is true of transistors in general) this potential scaled by the ratio of the resistances of resistors 113, 107 appears across resistors 113, 114. The emitter electrodes of transistors 111, 110 are therefore approximately 0.4 volt more positive than ground reference potential. The base electrode of transistor 112 will be still more positive by the sum of the base-emitter potentials of transistors 111 and 112, which quiescent potential is coupled via resistor 115 to the base electrode of transistor 101.

A similar quiescent potential is supplied to the base electrode of transistor 102 by the difference amplifier 60. Transistors 601, 602 with parallelly connected base-emitter circuits (including resistors 603, 604, respectively) will consequently have substantially equal collector currents providing the basis for a current mirror amplifier configuration. The collector-to-base degenerative feedback required to regulate the collector current of transistor 601 to equal applied input current is provided by the common-collector amplifier transistor 605. Resistors 606, 607 connect the input and output nodes 608, 609, respectively, of the current mirror amplifier configuration to amplifier output terminals $T_2$, $T_3$, respectively.

The operational characteristics of the difference amplifiers 50, 60, are substantially alike except for quiescent biasing differences introduced by the inclusion of resistors 603, 604 and of common-collector amplifier transistor 605 in the latter. The collector-to-emitter potential of transistor 602 is regulated to be equal to the sum of the base-emitter potentials of transistors 601 and 605. By resistive potential divider action, the potential drop across resistor 603 is one-hundredth of the following: the quiescent potential at terminal $T_2$ (of the order of 4 to 7 volts) minus the sum of the base-emitter offset potentials of transistors 601 and 605. The quiescent potential at node 609 is similar to that at node 608 if the quiescent potentials at terminals $T_2$, $T_3$ are equal. This is because of the current mirror amplifier action of transistors 601, 602 and the equal resistances of resistors 606, 607. The quiescent potential at nodes 608, 609 is equal to the drop across resistor 603 (0.05 to 0.1 volts, respectively) plus the base-emitter offset potentials of transistors 601, 605.

This value of quiescent potential is impressed upon the base electrode of transistor 102, and the overall degenerative feedback adjusts it to substantially equal the quiescent potential applied to the base electrode of transistor 101. The signal potentials appearing at terminals $T_2$, $T_3$ are differentially combined by the difference amplifier 60 and applied degeneratively to the base electrode of transistor 102.

The "pinch" resistors 103, 105, 107, 109, 113, 114 and 115 exhibit resistances which increase as the $\beta_{NPN}$ of the NPN transistors increases. These resistance changes can be used to reduce the signal voltage gain of the input differential amplifier stage 10 to counteract the increased signal current gain of transistors 11, 12 and 13 as the $\beta_{NPN}$'s increase.

For increasing $\beta_{NPN}$ below a certain value, the resistances of the pinch resistors 103, 105, 107, 109, 113, 114 and 115 will increase in proportion to each other and to $\beta_{NPN}$. This increase in resistance will produce a proportional decrease in the current levels in transistors 101, 102, 104, 106, 108, 110 and 111 according to Ohm's Law. The reduced current levels in transistors 101 and 102 will reduce their transconductances proportionately, and so the signal voltage gain of the input stage 10 which depends directly upon these transconductances will be similarly reduced.

As $\beta_{NPN}$ increases beyond that certain value, the resistance of pinch resistor 105 will increase faster than that of pinch resistor 103 with which it is serially connected. Since its resistance is higher than that of resistor 103, resistor 105 has a larger potential thereacross than resistor 103. As $\beta_{NPN}$ increases, there is a decrease in the potential at which a pinch resistor resistance characteristic shows a flattening—that is, a tendency towards constant-current behavior. This effect shows up in resistor 105 before resistor 103 and affects the potential division they provide for biasing the base electrodes of transistors 106 and 108 to reduce the conduction of those transistors. The reduction of the collector current of transistor 106 reduces the collector current available for transistor 111. The collector-to-base feedback of transistor 111, afforded by the emitter-follower action of transistor 112, reduces the base-emitter potentials of transistors 111 and 110. This adjusts the collector current of transistor 111 downward to substantially equal the collector current supplied by transistor 106 and also adjusts the collector current of transistor 110 downward accordingly. The reduced collector current of transistor 110 reduces the emitter currents of transistors 101 and 102, reducing their transconductance. This decrease in the transconductance of transistors 101 and 102 is in addition to the decrease attributable to the general increase of pinch resistor resistance with $\beta_{NPN}$.

The overall signal current gain of the cascade combination of transistors 11, 12 and 13 is determined by the product of their individual $\beta_{NPN}$'s. Their overall signal current gain tends to increase as the cube of increasing $\beta_{NPN}$. The reduction of the signal voltage gain of input signal stage 10 caused by each of the phenomena described in the preceding two paragraphs is proportional to $\beta_{NPN}$ increase. Their combined effect is to reduce the overall amplifier gain increase with increasing $\beta_{NPN}$ to a substantially linear relationship. This permits the variability of overall amplifier gain from one integrated circuit amplifier to another to be kept within acceptable bounds.

While the present invention has been described in a preferred embodiment for construction in monolithic integrated circuit form, it should be recognized that it has application to other forms of bridge-output amplifiers. For example, each pair of transistor means having their principal conduction paths serially connected between the power supply terminals and being operated in push-pull to supply output signal to a load terminal may have complementary rather than similar conductivity characteristics. The transistor means may be operated as transconductance amplifiers rather than, as preferred in monolithic integrated circuits, as current amplifiers. While individual feedback around each of the component push-pull amplifiers should not approach the effectiveness of the differential-mode feedback used to reduce the quiescent potential between the load terminals of the bridge-output amplifier, for fear of interfering with the effective operation of the differential-mode feedback, it should be appreciated that such individual feedback can be provided around one of the two push-pull amplifiers without fear of interfering with the effective operation of the differential-mode feedback.

What is claimed is:

1. In a bridge-output amplifier with
    first and second terminals between which operating potential as referred to a reference potential is applied;
    third and fourth terminals for supplying first and second output signals for application to respective ends of a floating load;
    means for generating an error signal responsive to the difference between an input signal potential referred to said reference potential and the signal appearing between said third and said fourth terminals; and
    first, second, third and fourth transistor means arranged for substantially Class B operation, the principal conduction path of the first being connected between said first and third terminals, of the second between said third and second terminals, of the third between said first and fourth terminals, of the fourth between said fourth and second terminals, the connection of their principal conduction paths forming a bridge, said first and fourth transistor means conducting in response to positive swings of said error signal, said second and third transistor means conducting in response to negative swings of said error signal;
    improved means for adjusting the balance of the bridge for quiescent potentials at said third and fourth terminals comprising:
    a difference amplifier having inverting and non-inverting input terminals connected respectively to said third terminal for receiving said first output signal and to said fourth terminal for receiving said second output signal, and having an output terminal for providing a feedback signal in response to the difference in potential between its input terminals; and
    means for applying at least a portion of the quiescent component of said feedback signal as a component of said error signal.

2. The improved means for adjusting the balance of the bridge set forth in claim 1 wherein said means for applying at least a portion of the quiescent component of said feedback signal as a component of said error signal includes means for partially bypassing the output terminal of said difference amplifier for a-c signals.

3. A bridge-output amplifier comprising:
    first and second terminals for connection to an operating voltage source;
    third and fourth terminals for connection to opposite ends of a load;
    first transistor means having collector and emitter electrodes with a collector-to-emitter path therebetween and having a base electrode;
    second and third and fourth transistor means each having similar electrical characteristics to said first transistor means, each having collector and emitter electrodes with a collector-to-emitter path therebetween and each having a base electrode;
    means connecting the emitter and collector electrodes of said first transistor means to said first terminal and to said third terminal, respectively;
    means connecting the emitter and collector electrodes of said second transistor means to said third terminal and to said second terminal, respectively;
    means connecting the emitter and collector electrodes of said third transistor means to said first terminal and to said fourth terminal, respectively;
    means connecting the emitter and collector electrodes of said fourth transistor means to said fourth terminal and to said second terminal, respectively;
    means for supplying base currents to said first and said second and said third and said fourth transistor means and leaving their respective base electrodes free to assume separate potentials, which includes first and second phase-splitting means each responding to the same error signal, said first phase-splitting means for supplying first and second drive signal currents exhibiting push-pull variations responsive to said error signal, said second phase-splitting means for supplying third and fourth drive signal currents exhibiting push-pull variations responsive to said error signal similar to those exhibited by said second and said first drive signal currents respectively, said first drive signal current being supplied to the base electrode of said first transistor means from a higher resistive impedance than the base electrode of said first transistor means itself presents, said second signal current being supplied to the base electrode of said second transistor means from a higher resistive impedance than the base electrode of said second transistor means itself presents, said third signal current being supplied to the base electrode of said third transistor means from a higher resistive impedance than the base electrode of said third transistor means itself presents, and said fourth signal current being supplied to the base electrode of said fourth transistor means from a higher resistive impedance than the base electrode of said fourth transistor means itself presents;

means for differentially combining the output signal potentials appearing at said third terminal and at said fourth terminal to obtain a feedback signal; and means for combining said feedback signal and an input signal to obtain said error signal, thereby to complete a direct-coupled degenerative feedback loop for differential components of said output signal potentials.

4. An amplifier comprising:

first, second, third, fourth and fifth terminals, said first and said second terminals for application of an energizing potential therebetween, said third terminal for application of input signals referred to said energizing potential, said fourth terminal for supplying an amplifier load in conjunction with at least one of said first and second and fifth terminals;

first and second current amplifier devices of similar conductivity type to each other, having an input electrode and an output electrode and a common electrode, said first device common electrode being direct current conductively coupled to said second terminal, said first device output electrode and said second device common electrode each being direct current conductively coupled to said fourth terminal, said second device output electrode being direct current conductively coupled to said first terminal;

means for supplying a quiescent potential to said fifth terminal which is between the potentials applied to said first and second terminals;

a first difference amplifier having inverting and non-inverting input terminals direct coupled respectively to separate ones of said fourth and fifth terminals and having an output terminal;

driver means for supplying the entire current applied to the input electrode of said first current amplifier device and for supplying the entire current applied to the input electrode of said second current amplifier device, the entire current applied to the input electrode of said second current amplifier device being supplied from a relatively high source impedance as compared to the impedance offered by said second current amplifier device at its input electrode;

a first phase-splitting means being included in said driver means, having an input terminal coupled from said third terminal, and having a first and a second output terminals for supplying signal currents in push-pull relationship in response to signal supplied to its input terminal, said first and said second output terminals thereof being respectively coupled to said first device input electrode and to said second device input electrode; and means for direct coupling the output terminal of said first difference amplifier to the input terminal of said first phase-splitting means, thereby completing a direct-coupled degenerative feedback loop for determining the quiescent potential appearing at said fourth terminal.

5. An amplifier comprising:

first, second, third, fourth and fifth terminals, said first and said second terminals for application of an energizing potential therebetween, said third terminal for application of input signals referred to said energizing potential, said fourth terminal for supplying an amplifier load in conjunction with at least one of said first and second and fifth terminals;

first and second current amplifier devices of similar conductivity type to each other, each having an input electrode and an output electrode and a common electrode, said first device common electrode being direct current conductively coupled to said second terminal, said first device output electrode and said second device common electrode each being direct current conductively coupled to said fourth terminal, said second device output electrode being direct current conductively coupled to said first terminal;

means for supplying a quiescent potential to said fifth terminal which is between the potentials applied to said first and second terminals;

a first difference amplifier having inverting and non-inverting input terminals coupled respectively to separate ones of said fourth and fifth terminals and having an output terminal;

a first phase-splitting means having an input terminal coupled from said third terminal and having first and second output terminals for supplying signal currents in push-pull relationship in response to signal supplied to its input terminal, said first and said second output terminals thereof being respectively coupled to said first device input electrode and to said second device input electrode; and means for coupling the output terminal of said first difference amplifier to the input terminal of said first phase-splitting means, wherein said first difference amplifier includes a current mirror amplifier having a common terminal referenced in potential to at least one of said first and said second terminals and having an input and an output terminal, first and second resistive elements having substantially equal resistances and respectively direct coupling said input terminal and said output terminal of said current mirror amplifier to separate ones of said first differential amplifier input terminals, and means coupling said current mirror amplifier output terminal to said first differential amplifier output terminal.

6. An amplifier as claimed in claim 5 wherein said current mirror amplifier comprises:

first and second similar transistors having their collector electrodes respectively connected to said current mirror input and output terminals, having their base electrodes each connected to said current mirror amplifier input terminal and having their emitter electrodes direct current conductively coupled to said mirror amplifier common terminal.

7. An amplifier as claimed in claim 6 wherein said first phase-splitting means includes:

third and fourth and fifth transistors of similar conductivity type to said first transistor, each having base and emitter and collector electrodes, the emitter electrodes of said third and said fourth transistors being connected to said current mirror common terminal, said base electrodes of third and fourth transistors being direct coupled from said input terminal of said first phase-splitting means direct coupled in turn from current mirror output terminal, said third transistor collector electrode and said fifth transistor emitter electrode being direct current conductively coupled to said input terminal of said first phase-splitting means, the collector electrodes of said fourth and fifth transistors being respectively connected to separate ones of said first and said second output terminals of said first phase-splitting means; and means for providing a source of bias voltage coupled between said fifth transistor base electrode and said current mirror amplifier common terminal.

8. An amplifier comprising:

first, second, third, fourth and fifth terminals, said first and said second terminals for application of an energizing potential therebetween, said third terminal for application of input signals referred to said energizing potential, said fourth terminal for supplying an amplifier load in conjunction with at least one of said first and second and fifth terminals;

first and second current amplifier devices of similar conductivity type to each other, each having an input electrode and an output electrode and a common electrode, said first device common electrode being direct current conductively coupled to said second terminal, said first device output electrode and said second device common electrode each being direct current conductively coupled to said fourth terminal, said second device output electrode being direct current conductively coupled to said first terminal;

means for supplying a quiescent potential to said fifth terminal which is between the potentials applied to said first and second terminals;

a first difference amplifier having inverting and non-inverting input terminals coupled respectively to separate ones of said fourth and fifth terminals and having an output terminal;

a first phase-splitting means having an input terminal coupled from said third terminal and having first and second output terminals for supplying signal currents in push-pull relationship in response to signal supplied to its input terminal, said first and said second output terminals thereof being respectively coupled to said first device input electrode and to said second device input electrode;

means for coupling the output terminal of said first difference amplifier to the input terminal of said first phase-splitting means, an input amplifier stage for comparing input signal applied to one of its input circuits with feedback signal applied to another of its input circuits to provide an error signal in its output circuit;

a controlled-gain amplifier direct coupling said output circuit of said input amplifier stage to said input terminal of said first phase-splitting means;

a second difference amplifier having inverting and non-inverting input terminals coupled respectively to separate ones of said fourth and fifth terminals and having an output terminal direct coupled to said other input circuit of said input amplifier stage; and means connected in parallel with said other input circuit of said input amplifier stage for providing the dominant low-frequency time constant for said feedback signal.

9. An amplifier comprising:

first, second, third, fourth and fifth terminals, said first and said second terminals for application of an energizing potential therebetween, said third terminal for application of input signals referred to energizing potentials, said fourth and said fifth terminals for connection of an amplifier load therebetween;

first and second and third and fourth current amplifier devices of similar conductivity type, each of said first and said second and third and fourth current amplifier devices having an input electrode and an output electrode and a common electrode, the common electrodes of said first and said third devices each being direct current conductively coupled to said second terminal, said first device output electrode and said second device common electrode each being direct current conductively coupled to said fourth terminal, said third device output electrode and said fourth device common electrode each being direct current conductively coupled to said fifth terminal, the output electrodes of said second and said fourth devices each being direct current conductively coupled to said first terminal;

a first difference amplifier having inverting and non-inverting input terminals coupled respectively to separate ones of said fourth and fifth terminals and having an output terminal;

a first phase-splitting means having an input terminal coupled from said third terminal and having first and second output terminals for supplying signal currents in push-pull relationship in response to signal supplied to its input terminal, said first and said second output terminals thereof being respectively coupled to said first device input electrode and to said second device input electrode;

a second phase-splitting means having an input terminal shared with said first phase-splitting means and having first and second output terminals for supplying signal currents in push-pull relationship in response to signal supplied to its input terminal, said first and said second output terminals thereof being respectively coupled to said third device input electrode and to said fourth device input electrode; and means for coupling the output terminal of said first difference amplifier to the input terminal of said first phase-splitting means.

10. An amplifier as claimed in claim 9 wherein said first and said second phase-splitting means together comprise the following:

first, second, third, fourth and fifth transistors of like conductivity type, each having base and emitter and collector electrodes, the collector electrodes of said first and second and third and fourth transistors being respectively coupled to the input electrodes of said first and second and fourth and third current amplifier devices; the emitter electrodes of said first and third transistors being direct current conductively coupled to said fifth transistor collector electrode and direct coupled to said fifth transistor base electrode;

said fifth transistor base electrode and the base electrodes of said second and fourth transistors being direct coupled to said shared input terminal;

the emitter electrodes of said second, fourth and fifth transistors being direct current conductively coupled to said first amplifier terminal; and means for providing a source of bias voltage between said first terminal and each of the base electrodes of said first and third transistors.

11. An amplifier as claimed in claim 10 wherein a sixth transistor has an emitter electrode direct current conductively coupled to said second transistor collector electrode, has a collector electrode direct current conductively coupled to the input electrode of said second current amplifier device and has a base electrode direct coupled to said means adapted for providing a source of bias voltage to receive said bias voltage, thereby providing via its emitter-to-collector path at least a portion of the heretofore claimed coupling of said second transistor collector electrode to the input electrode of said second current amplifier.

* * * * *

UNITED STATES PATENT OFFICE
CERTIFICATE OF CORRECTION

PATENT NO. : 3,983,502

DATED : September 28, 1976

INVENTOR(S) : Carl Franklin Wheatley, Jr.

It is certified that error appears in the above-identified patent and that said Letters Patent are hereby corrected as shown below:

Column 6, lines 24-25, "commen-surately" should read -- commensurately --.
Column 8, line 20, after "emitter" insert -- " --.
Column 14, line 30, "collector" should be in quotation marks.
Column 14, line 30, "emitter" should be in quotation marks.
Column 14, line 31, "collector-to-emitter" should be in quotation marks.
Column 14, line 32, "base" should be in quotation marks.
Column 14, line 35, "collector" should be in quotation marks.
Column 14, line 35, "emitter" should be in quotation marks.
Column 14, line 36, "collector-to-emitter" should be in quotation marks.
Column 14, line 37, "base" should be in quotation marks.
Column 14, line 38, "emitter" should be in quotation marks.
Column 14, line 38, "collector" should be in quotation marks.
Column 14, line 41, "emitter" should be in quotation marks.
Column 14, line 41, "collector" should be in quotation marks.
Column 14, line 44, "emitter" should be in quotation marks.
Column 14, line 44, "collector" should be in quotation marks.
Column 14, line 47, "emitter" should be in quotation marks.
Column 14, line 47, "collector" should be in quotation marks.
Column 14, line 50, "base" should be in quotation marks.
Column 14, line 52, "base" should be in quotation marks.
Column 14, line 64, "base" should be in quotation marks.
Column 14, line 66, "base" should be in quotation marks.
Column 14, line 68, "base" should be in quotation marks.
Column 15, line 2, "base" should be in quotation marks.
Column 15, line 4, "base" should be in quotation marks.
Column 15, line 6, "base" should be in quotation marks.
Column 15, line 8, "base" should be in quotation marks.
Column 15, line 10, "base" should be in quotation marks.

Signed and Sealed this

Fourteenth Day of December 1976

[SEAL]

Attest:

RUTH C. MASON
Attesting Officer

C. MARSHALL DANN
Commissioner of Patents and Trademarks